United States Patent [19]
Bovitz

[11] B 3,986,039
[45] Oct. 12, 1976

[54] TOGGLE SWITCH/INDICATOR CIRCUIT
[75] Inventor: Thomas Frank Bovitz, Hibbing, Minn.
[73] Assignee: Sperry Rand Corporation, New York, N.Y.
[22] Filed: May 2, 1974
[21] Appl. No.: 466,444
[44] Published under the second Trial Voluntary Protest Program on January 20, 1976 as document No. B 466,444.

[52] U.S. Cl............................ 307/137; 307/247 A; 340/365 E
[51] Int. Cl.² ....................................... H03K 17/56
[58] Field of Search ....... 307/134, 136, 137, 247 A, 307/247 R; 340/365 E; 328/165

[56] References Cited
UNITED STATES PATENTS
2,716,230  8/1955  Oliwa .............................. 340/365 E Primary Examiner—David Smith, Jr.
Attorney, Agent, or Firm—Thomas J. Nikolai; Kenneth T. Grace; Marshall M. Truex

[57] ABSTRACT

A toggle switch indicator circuit for use with digital logic circuits which may be manually set and cleared by means of a manually operated push-button switch and which incorporates a debounce network and an indicator for displaying the state of the toggle switch at a remote point.

4 Claims, 1 Drawing Figure

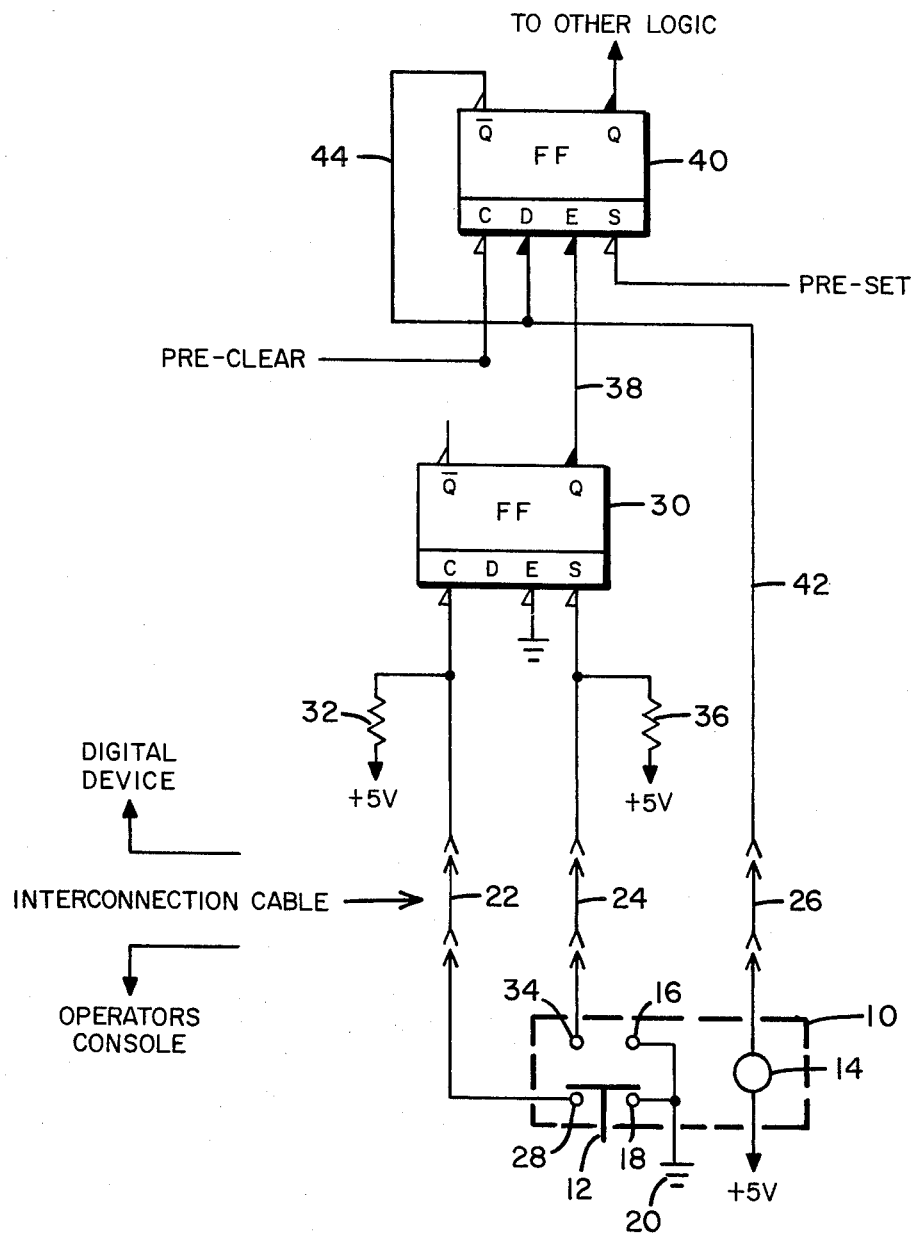

TOGGLE SWITCH/INDICATOR CIRCUIT

BACKGROUND OF THE INVENTION

In digital computing apparatus and related equipment it is often desirable, for maintenance purposes, to be able to manually enter a binary number pattern into a register and to have an indication of the state of each stage of the register from a location which may be remote from the register in question. For example, in many computing systems, the operator's console or the maintenance unit may be located several feet from the central processor unit (CPU) and for convenience, it is desirable to be able to enter a binary data word or an address into a register in the CPU from the remote console. In the past this has been accomplished by having a push-button switch and an associated indicator lamp connected to each stage of the CPU's register by wires such that when the push-button switch is operated, the binary state of the register stage can be changed and a lamp illuminated or extinguished to indicate the condition of the stage.

Problems have arisen in such prior art arrangements because of the inherent contact bounce or vibration present in most all mechanically operated switches which are commercially available at a reasonable price. With these switches, each operation produces a series of makes and breaks rather than a single make or break due to contact bounce. As such, the register stage to which it is connected may be toggled an indeterminate number of times and end up in a state different from that which was intended by the operator.

Prior art solutions to the contact bounce problem have involved the use of delay circuits triggered by the first pulse of a series of noise pulses which disable the logic network for a period sufficient to enable the noise to subside. Exemplary of this approach is the Morgan et al U.S. Pat. No. 3,795,823 and the McIntosh U.S. Pat. No. 3,673,434. Another proposed solution as set forth in the Brahan U.S. Pat. No. 3,381,143 involves the use of a set-reset type flip-flop interposed between the switch contacts and the output logic circuit such that when the mechanical switch is repositioned, the flip-flop switches state, but successive makes and breaks caused by bounce do not reverse the state of the flip-flop and therefore do not affect the voltage appearing at the output of the flip-flop.

The present invention is considered to be an improvement over that disclosed in the aforementioned Brahan patent in that an inexpensive double-pole double-throw push-button switch and indicator assembly can be made to operate as a toggle switch having a debounce feature, the power supply for the indicator being the same as that for the toggle and debounce circuitry.

In the apparatus of the present invention a pair of transition edge-triggered integrated circuit flip-flops are interconnected with each other and with the push-button switch and indicator lamp so that a first depression of the push-button switch will cause the state of one of the flip-flops to switch and operate the indicator and a second depression of the switch will cause the flip-flop to revert to its prior state and extinguish the indicator. The other flip-flop prevents noise produced by contact bounce from affecting the state of said one flip-flop.

OBJECTS

It is accordingly an object of the present invention to provide an improved toggle switch and indicator assembly for use in electronic digital applications.

Another object of the invention is to provide a manual push-button type toggle switch and indicator assembly which can be used in electronic digital equipment without introducing erroneous operation because of contact bounce.

Still another object of this invention is to provide an inexpensive manually operable toggle switch which produces a noise free output even when the contacts of the push-button switch are subject to bounce upon the closing thereof.

These and other objects and advantages of the invention will become apparent to those of ordinary skill in the art upon the reading of the following detailed description in light of the accompanying drawing in which is illustrated an electrical schematic diagram of the preferred embodiment.

DETAILED DESCRIPTION

Referring to the FIGURE, there is shown enclosed by the broken line box 10 a double-pole double-throw push-button type switch 12 and an associated indicator lamp 14 which are commercially available as a self-contained unit in various forms. The poles 16 and 18 of push-button switch 12 are each connected to a point of reference potential such as ground 20.

The self-contained push-button switch and indicator assembly 10 may be located on an operator's console and connected by conductors 22, 24 and 26 to the circuits to be operated which may be somewhat remote from the operator's console. Hence, as will be more fully explained hereinbelow, an operator sitting at the console may enter a bit of information into the remotely located digital apparatus and obtain an indication of the resulting state of that remote circuit.

Continuing with the description of the interconnection of the various components forming the preferred embodiment, a pole 28 of the push-button switch 12 is connected by way of conductor 22 to the Clear input terminal of an integrated circuit edge-triggered flip-flop 30. This Clear input terminal is also coupled through a bias resistor 32 to a source of positive potential such as, for example, a direct current potential of +5 volts. In a similar fashion, the pole 34 of switch 12 is connected by way of a conductor 24 to the Set terminal of the edge-triggered flip-flop 30 and this Set terminal is also coupled through a bias resistor 36 to the same source of DC potential. Thus, when the push-button switch 12 is in a first position connecting poles 18 and 28 together, the "Pre-Clear" input terminal (C) of flip-flop 30 will be held at ground potential whereas the Pre-Set terminal (S) will be at approximately +5 volts. When the push-button switch 12 is operated to bridge poles 16 and 34, the Set terminal (S) will be connected to ground 20 and the "Pre-Clear" terminal (C) will be at +5 volts.

The true output terminal (Q) of the flip-flop 30 is connected by conductor 38 to the Enable input terminal (E) of a second edge-triggered or D-type flip-flop 40. The indicator lamp 14 has a first terminal thereof connected to the positive source of DC potential (+5 volts) and its other terminal connected through conductor 26 and conductor 42 to the Data input terminal (D) of the edge-triggered flip-flop 40. The complement output (Q) of the edge-triggered flip-flop 40 is connected by means of a conductor 44 back to its Data input terminal (D).

Now that the details of the construction of the preferred embodiment have been set forth, consideration will next be given to its mode of operation.

OPERATION

The edge-triggered flip-flops 30 and 40 may be the Type SN 7474 integrated circuit flip-flops manufactured and sold by the Texas Instruments Corporation of Dallas, Texas and, as such, when the Pre-Clear signal assumes a low binary state, the flip-flop 40 is switched to its cleared state in which the $\overline{Q}$ output terminal is clamped at approximately +5 volts. As such, no current flows through the indicator 14 and it is therefore off. If a low signal is now applied to the Pre-Set terminal, S, of flip-flop 40 the flip-flop will be switched to its Set state in which the Q output terminal is high (+5 volts) and the $\overline{Q}$ output terminal will be at ground. A current will therefore flow through the indicator 14 causing it to be illuminated.

When the push-button 12 is in its normally closed position so as to bridge the poles 18 and 28, a constant ground will be applied to the Clear input terminal of the debounce flip-flop 30. As the push-button switch is pushed towards its normally open position, this constant Clear signal is removed from the flip-flop 30 and a ground signal is applied to the Set input terminal, S, of the flip-flop 30 as the push-button 12 initially makes contact between the poles 16 and 34. This ground signal applied to the terminal, S, causes the debounce flip-flop 30 to set. As the flip-flop 30 sets, a positive transition signal appears on conductor 38 and is applied to the Enable input terminal, E, of the edge-triggered flip-flop 40. This transition on the E input of flip-flop 40 causes it to become set because at this time the Data input terminal, D, is high due to the fact that the flip-flop 40 had been pre-cleared. The indicator therefore becomes illuminated and the spring biased push-button switch 12 returns to its normally closed position as the operator removes his finger therefrom.

When the switch is again depressed, the debounce flip-flop 30 operates in the manner previously described to produce a positive transition on its output terminal, Q. However, since at this time the toggle flip-flop 40 is set, its D input is low. When this positive transition occurs on the E input of flip-flop 40, flip-flop 40 will be cleared and the indicator will go off.

Since the debounce flip-flop 30 responds only to the initial transition occurring when ground is connected to either the Clear or the Set terminal, repeated making and breaking of the contacts 16 – 34 or 18 – 28 caused by contact bounce will have no affect on the state of the flip-flop 30.

Thus it can be seen that the present invention provides a way of utilizing a momentary action push-button switch to act as a toggle switch having an indication of the on-off condition of that switch which ensures that no noise spikes will appear on the output line therefrom, even when the push-button switch is subject to contact bounce. Furthermore, only one DC voltage need be made available to operate the switch and its associated indicator. The toggle flip-flop 40, being a Type D flip-flop, can be pre-cleared or pre-set from an outside source (not shown) so as to predetermine the state of the toggle flip-flop 40 to either illuminate the light 14 or extinguish it.

It is to be understood that although the invention has been specifically described in conjunction with a particular embodiment, that various modifications may readily be made without departing from the spirit of the invention.

What is claimed is:
1. Switching apparatus comprising in combination:
   a. a double-pole double-throw push-button switch having a pair of normally closed and normally open contacts;
   b. an indicator lamp located in close proximity to said push-button switch;
   c. first and second transition edge-triggered flip-flops of the type having a Clear input terminal, a Set input terminal, a Data input terminal and an Enable input terminal and first and second complementary output terminals;
   d. means connecting one of said pair of normally closed and normally open contacts individually to said Clear input terminal and said Set input terminal of said first flip-flop respectively and the other of said pair of normally closed and normally open contacts to a common point of fixed potential;
   e. means connecting said first output terminal of said first flip-flop to said Enable input terminal of said second flip-flop;
   f. means connecting said indicator lamp in series circuit between a source of positive potential and said Data input terminal of said second flip-flop; and
   g. means connecting said second output terminal of said second flip-flop back to the Data input terminal of said second flip-flop, the arrangement being such that the first momentary closure of said normally open contacts sets said first flip-flop and enables the toggling of said second flip-flop from its present binary state to its opposite binary state, said indicator lamp being illuminated only when said second flip-flop is in a predetermined one of its two possible states.

2. Apparatus as in claim 1 wherein said push-button switch and indicator lamp are remotely located with respect to said first and second flip-flops.

3. Apparatus as in claim 1 and further including direct current biasing means connected to said Clear and Set terminals of said first flip-flop.

4. Apparatus as in claim 3 wherein said source of positive potential is connected to said biasing means.

* * * * *